United States Patent

Tsu et al.

[11] Patent Number: 6,096,597
[45] Date of Patent: Aug. 1, 2000

[54] METHOD FOR FABRICATING AN INTEGRATED CIRCUIT STRUCTURE

[75] Inventors: Robert Tsu; William R. McKee, both of Plano, Tex.; Shimpei Iijima, Tokyo, Japan; Isamu Asano, Saitama, Japan; Masato Kunitomo, Omeshi, Japan; Tsuyoshi Tamaru, Tokyo, Japan

[73] Assignee: Texas Instruments Incorporated, Dallas, Tex.

[21] Appl. No.: 09/014,204

[22] Filed: Jan. 28, 1998

Related U.S. Application Data

[60] Provisional application No. 60/036,481, Jan. 31, 1997.
[51] Int. Cl.$^7$ ................................................ H01L 21/8242
[52] U.S. Cl. .................................... 438/240; 438/785
[58] Field of Search .............................. 438/264, 261, 438/216, 287, 591, 785, 240

[56] References Cited

U.S. PATENT DOCUMENTS

| | | | |
|---|---|---|---|
| 4,201,798 | 5/1980 | Lindmayer | 427/74 |
| 5,468,687 | 11/1995 | Carl | 437/235 |
| 5,486,488 | 1/1996 | Kamiyama | 437/60 |
| 5,508,221 | 4/1996 | Kamiyama | 437/60 |
| 5,610,097 | 11/1995 | Shimizu | 437/175 |
| 5,837,593 | 11/1998 | Park | 438/396 |
| 5,859,760 | 1/1999 | Park | 361/313 |
| 5,913,117 | 6/1999 | Lee | 438/240 |

*Primary Examiner*—Charles Bowers
*Assistant Examiner*—Matthew Whipple
*Attorney, Agent, or Firm*—Robby T. Holland; Carlton H. Hoel; Frederick J. Telecky, Jr.

[57] ABSTRACT

In one embodiment, the present invention provides a method of treating a dielectric layer 24. First, the dielectric layer is heated while being subjected to an $O_2$ plasma. After that, the dielectric layer is heated while being subject to an ozone environment. This method can be useful in forming a capacitor 12 dielectric 24. In turn, the capacitor could be used in a DRAM memory device.

13 Claims, 6 Drawing Sheets

METHOD FOR FABRICATING AN INTEGRATED CIRCUIT STRUCTURE

This is a Non Provisional application filed under 35 USC 119(e) and claims priority of prior provisional, Ser. No. 60/036,481 of inventor Tsu, et al., filed Jan. 31, 1997.

RELATED PATENT APPLICATION

The following co-assigned patent applications are related to the present invention and are hereby incorporated herein by reference.

| Pat. or Ser. No. | Filing Date | Issue Date | Attorney Docket |
|---|---|---|---|
| 09/014,724 | 01/28/98 | | TI-21537 |
| 09/014,484 | 01/28/98 | | TI-21973 |
| 5,972,769 | 12/18/97 | 10/26/99 | TI-21704 |

FIELD OF THE INVENTION

This invention relates generally to the fabrication of semiconductor devices and specifically to a method of treating a dielectric which can be used in the formation of an integrated circuit capacitor.

BACKGROUND OF THE INVENTION

DRAM memory cell sizes continue to decrease. For example, memories which store 64 Mb of information are now in production with plans to implement 256 Mb and 1 Gb memories soon. These high density memories have a design rule of a minimum 0.35 µm or less. As the cells get smaller, conventional dielectrics such as nitride/oxide (N/O) can hardly supply sufficient storage capacitance. This requirement is due to the fact that N/O materials have a low dielectric constant of about seven. In general, a simple formula can be used to express capacitance, namely $C_s/A = \epsilon_0 \epsilon_r/t$, where $C_s$ represents storage cell capacitance, A is the total surface area of the capacitor, t is the dielectric film thickness, and $\epsilon_0$ and $\epsilon_r$ stands for vacuum and relative permitivities, respectively. To increase capacitance, complicated cell structures including multiple fins and disks have been proposed to increase the surface area between the plates and dielectric. These complex cell structures, however, are difficult to fabricate and, therefore, not suitable for manufacturing.

Storage capacitors using high dielectric constant (k) materials including tantalum pentoxide ($Ta_2O_5$), barium strontium titanate (BST), strontium titanate ($SrTiO_3$), and lead zirconium titanate (PZT) have been proposed as dielectrics for simple cell structures including simple stacked cell (STC). The high dielectric constant of these materials give sufficient storage capacitance. Unfortunately, high dielectric constant materials including BST, $SrTiO_3$, and PZT are difficult to form using standard processing techniques. For example, it is difficult to control dielectric composition.

Although $Ta_2O_5$ has a dielectric constant of about 25 compared with BST's dielectric constant of about 400, the Ta2O5 capacitors are much easier to fabricate than BST capacitors. $Ta_2O_5$ capacitors, however, usually have high leakage current density. Therefore, a need exists for a process of forming a high dielectric capacitor which overcomes many of the problems of the prior art.

SUMMARY OF THE INVENTION

The present invention provides a method for forming an improved dielectric material. This material can be used in an integrated circuit capacitor which can in turn be used in a wide variety of devices including dynamic random access memories (DRAMs). In one aspect, the present invention proposes a two step anneal after dielectric deposition to improve the dielectric film properties as well as the interface between the dielectric and underlying conductor. This process results in lower leakage current density and lower effective oxide thickness attributed to the increase of the dielectric constant.

In one embodiment, the present invention provides a method of treating a dielectric layer. First, the dielectric layer is heated while being subjected to an $O_2$ plasma. After that, the dielectric layer is heated while being subject to an ozone environment. This method can be useful in forming a capacitor dielectric. In turn, the capacitor could be used in a DRAM memory device.

BRIEF DESCRIPTION OF THE DRAWINGS

The above features of the present invention will be more clearly understood from consideration of the following descriptions in connection with accompanying drawings in which:

FIG. 1b is a schematic diagram of the structure of FIG. 1a.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1A:
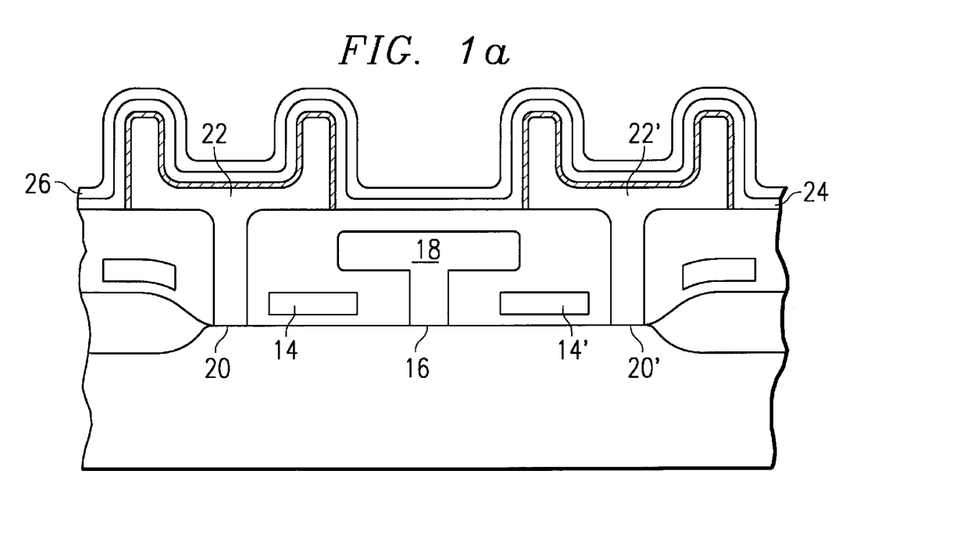
FIG. 1a is a cross-sectional view of a DRAM cell which can utilize the structure of the present invention.
Figure 1B:
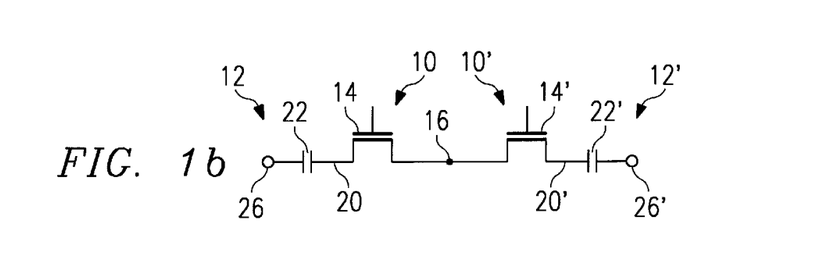

FIG. 1a illustrates a simplified view of a first embodiment DRAM cell (actually two cells) which includes a capacitor which utilizes the structure of the present invention. FIG. 1b is a schematic diagram of the DRAM cells of FIG. 1a. As will be clear to those familiar with DRAMs, the cross-sectional view and schematic diagram shown in FIGS. 1a and 1b appear similar to prior art devices. The composition of materials and method of forming them, however, make the present invention unique compared with the prior art.

Referring now to FIGS. 1a and 1b together, each DRAM cell includes a pass transistor 10 coupled in series with a capacitor 12. The gate 14 of pass transistor 10 comprises one of the word lines WL of the memory array. (A memory array will be described in more detail with respect to FIG. 2a). A shared source/drain region 16 of each pass 10 is coupled to bit line 18. The other source/drain region 20 is coupled to the storage node electrode 22 of capacitor 12. Capacitor 12 further includes dielectric layer 24 and cell plate 26.

Figure 2A:
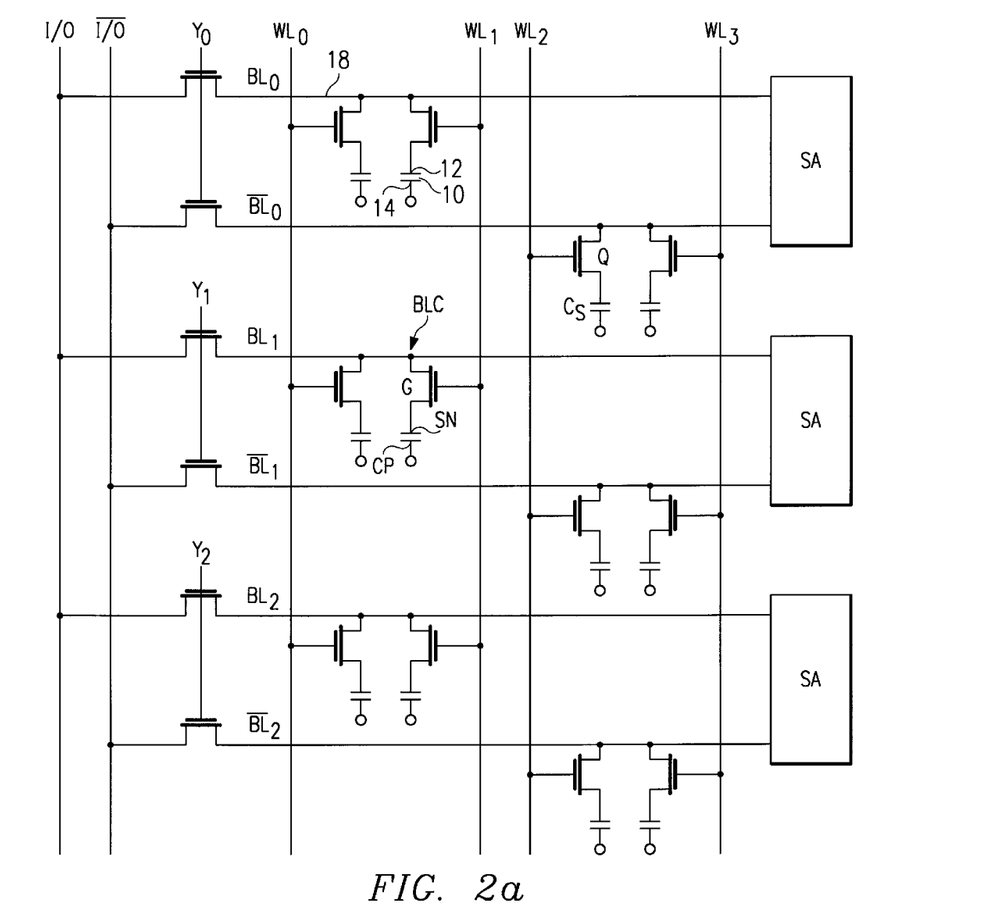
FIGS. 2a–2c are diagrams of a DRAM circuit which can utilize the capacitor of the present invention.

A simplified schematic diagram of a DRAM array is illustrated in FIG. 2a. As shown, a plurality of memory cells can be formed in an array of rows and columns. FIG. 2a illustrates only six bit lines BL and four word lines WL in what in actuality would likely be a much larger array. The pass transistor Q of each memory cell has a gate G coupled to a word line WL and a source/drain region BLC (for bit line contact) coupled to a bit line BL. The transfer gate G of one pass transistor Q will be electrically coupled to the word line WL for a number of other pass transistors.

FIG. 2a also illustrates some of the peripheral circuitry which would be included in a memory array. For example, each pair of bit lines BL and BL(bar) is coupled to a sense amplifier SA. The bit lines BL and BL(bar) are also coupled to input/outline lines I/O and I/O(bar) through select transistors $Y_0-Y_2$. Other peripheral circuitry such as the row decoders, column decoders, address buffers, I/O buffers and so on are not illustrated here. For the purposes of this invention, the memory cell and fabrication method are independent of the memory architecture.

As an example, the memory array can be designed as an asynchronous memory or as a synchronous memory. A synchronous memory can be timed with an internal clock (not shown) or an external clock (not shown). The device can have a single external data terminal or multiple external data terminals (i.e., wide word). The array can include a total of 4 megabits, 16 megabits, 64 megabits, 256 megabits, one gigabit or more.

Figure 2B:
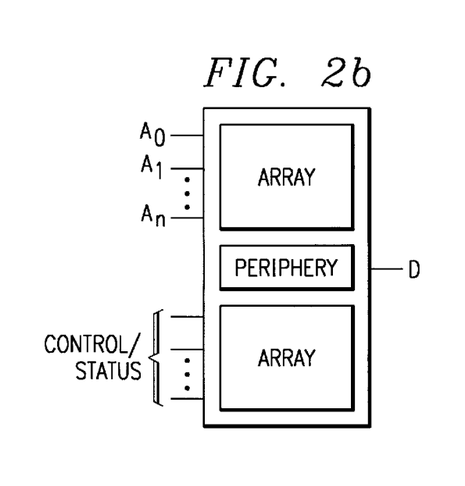

A simplified block diagram of a memory device is shown in FIG. 2b. The internal device circuitry includes an array and peripheral circuitry. The array may be divided into a number of blocks depending upon the device architecture. Sense amplifiers may be interleaved within the array blocks.

Several external terminals are illustrated in FIG. 2b. Address terminals $A_0, A_1, \ldots, A_n$ are provided for receiving row and column addresses. These terminals may be multiplexed (i.e., a first address is applied at a first time and a second address applied at a second time). A single data terminal D is also illustrated. This terminal may comprise an input, an output or an input/output. Other data terminals may also be included. For example, a wide word device will have multiple data terminals. In general, these terminals are provided for receiving input signals from circuitry (not shown) external of the array and for providing output signals to circuitry (not shown) external of the array.

FIG. 2b also illustrates a number of control/status signals. These signals are used to operate the memory device. For example, an asynchronous memory device may be operated by applying chip select, row address strobe and column address strobe signals. Other signals may indicate whether a read or write operation is being performed. In a synchronous device, one of the control signals may be a clock signal. Status signals may provide information about the device to the external system. For example, the device may include a signal indicating whether a refresh operation is taking place or which portion of the array is being accessed.

Figure 2C:
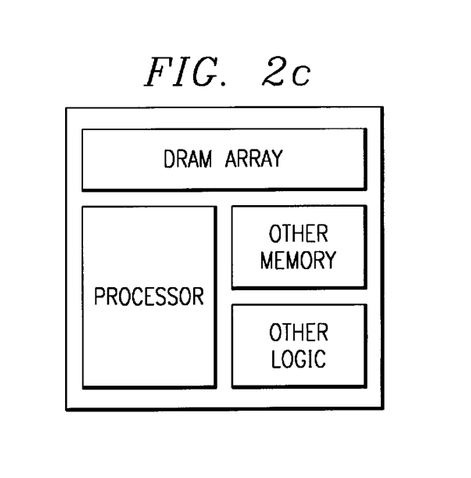

A memory array of the present invention could also be embedded in a larger integrated circuit device. An embedded memory is a memory array and its associated control circuitry on the same integrated circuit as a substantial amount of logic. FIG. 2c has been included to illustrate a simple block diagram of an embedded memory. In this example, a DRAM array is included along with a processor (e.g., microprocessor, digital signal processor, specialty processor, microcontroller), another memory array (e.g., SRAM, non-volatile memory such as EPROM, EEPROM, flash memory, PROM, ROM, another DRAM array) and other logic circuitry. These particular blocks have been chosen to illustrate the wide variety of other logic which could be included. Any combination of the devices could be included.

As applied to a DRAM, the present invention relates to an improved storage capacitor 12. Prior art capacitance has been increased by either increasing the surface area between the two plates 22 and 26 of capacitor 12 or by using a high dielectric constant (high-k or HDC) material for the cell capacitor dielectric 24. Materials such as tantalum pentoxide ($Ta_2O_5$), barium strontium titanate or simply BST ($Ba_{1-x}Sr_xTiO_3$), strontium titanate ($SrTiO_3$) and lead zirconium titanate or simply PZT ($Pb_{1-x}Zr_xTiO_3$) have been proposed for simple cell structures such as the simple stack cell (STC). Co-pending patent applications Ser. Nos. 09/014,724 (TI-21537) and 09/014,484 (TI-21973) disclose non-planar capacitors which can be used with high dielectric constant materials. The capacitors of either of these disclosures can be utilized herein.

A method of forming a DRAM array will now be described with reference to FIGS. 3a–3i. This method is included to illustrate how the present invention could be easily incorporated in a DRAM process flow.

Figure 3A:
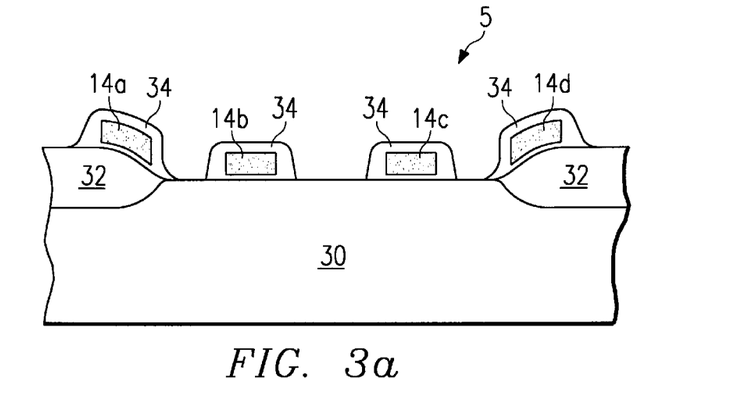
FIGS. 3a–3i are cross-sectional views illustrating one process flow for forming a DRAM which utilizes the capacitor of the present invention.

Referring now to FIG. 3a, a DRAM device 5 will be formed in a semiconductor substrate 30. The substrate is preferably a p-type substrate although n-type substrates could alternatively be used. In addition, substrate 30 need not be a substrate at all. In this context, a substrate can be a substrate, an epitaxially grown layer, a well (or tub or tank) formed in another layer, a semiconductor layer formed over an insulator (e.g., SOI, SOS) or any other semiconductor region.

FIG. 3a illustrates field isolation regions 32 and four word line/pass gates 14. While illustrated with field isolation 32, it is also noted that other isolation techniques such as trench isolation can be used. The regions 14b and 14c will form the gates of the two memory cells which will be illustrated in these drawings. Word lines 14a and 14d, on the other hand, will serve as the pass transistors for gates in other rows of the device. The gate regions 14 preferably comprise doped polysilicon but other conductive materials such as metals or stacked layers of polysilicon and metals can be used.

In the preferred embodiment, each of the word lines 14 is surrounded by a nitride (e.g., $Si_3N_4$) region 34. This region 34 can be used for a self-aligned contact (SAC) etch process as described below.

Figure 3B:
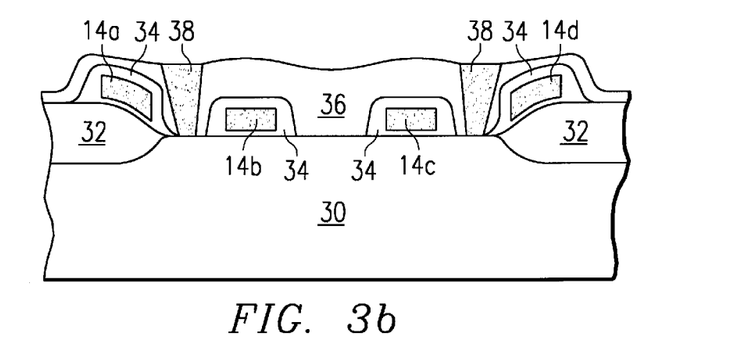

Referring now to FIG. 3b an insulating layer 36 is formed over the device. In the preferred embodiment, insulating layer 36 comprises an oxide layer (e.g., formed from the decomposition of tetraethyloxysilane or TEOS) on a BPSG (borophosphosilicate glass) layer. Oxides formed from TEOS tend to have better oxide properties than BPSG in terms of breakdown, leakage, and density. Hence, the oxide formed from TEOS is deposited on top of BPSG in the preferred embodiment.

A plug 38 is formed within an insulating layer 36. Storage plate plugs 38 can be formed, for example, through standard patterning and etching. In one example, the plug can be formed by use of a self-aligned contact etch. In this process, an etchant which removes oxide region 36 without removing nitride region 34 is introduced in the area above the contact. The etchant will then expose the substrate 30 surface without exposing word lines 14. In this manner, the plug 38 can be formed without electrically shorting to the word line 14. The plug 38 material can be doped polysilicon or a metal. The nature of the plug is not critical to the present invention.

Figure 3C:
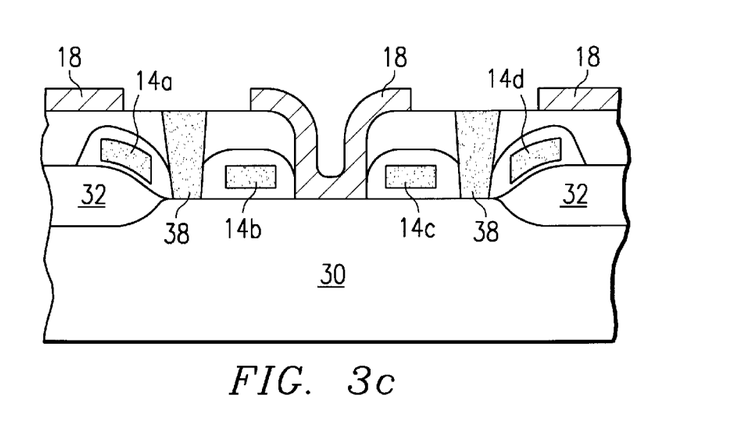

Bit line regions 18 are formed in FIG. 3c. As illustrated, in this example, the two memory cells being fabricated will share a single bit line (see FIG. 2a for the electrical schematic). While it is not critical to this invention, the bit line 18 may comprise any conductive material such as silicon or a metal.

Figure 3D:
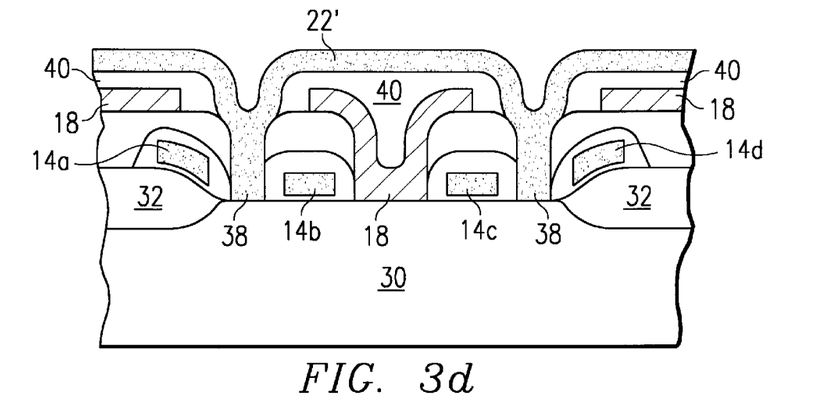

Referring now to FIG. 3d, formation of the storage node 22 of the capacitors is continued. An insulating layer 40 is formed over the bit lines 18. Using standard patterning and etching techniques, a contact hole is formed through insulating layer 40 to expose plug 38. Although not illustrated, a self-aligned contact etch may be used. Subsequently a second conductive layer or 22- base layer storage node is formed over the insulating layer and so as to contact plugs 38.

In the preferred embodiment, base storage node layer 22' is deposited over the insulating region 40 and plug 38. Base metal layer 22' can be formed by chemical vapor deposition (CVD), physical vapor deposition (PVD), or plasma enhanced chemical vapor deposition (PECVD), as examples. In the preferred embodiment, storage node layer 22' is a material that is relatively good for oxidation resistance and has high work function. The preferred materials for base storage node metal layer 22' are listed in Table 1. It is noted, however, than other metals may alternatively be used. For example, other transition metals such as ruthenium (Ru), iridium (Ir), and molybdenum (Mo), suicides such as W/TiN, W/WSi$_x$, WSi$_x$, Si$_x$/TiN, WSi$_x$N$_y$, TaSi$_x$, TaSi$_x$N$_y$, TiSi$_x$, TiSi$_x$N$_y$, and conductive oxide materials including ruthenium oxide (RuO$_2$), iridium oxide (IrO$_2$) and (La,Sr) CoO$_3$ can be used for base storage node layer 22'. The base storage node layer 22' can be formed from the same material as plug 38, but this is not a requirement. For example, a metal base electrode 22' can be formed over a polysilicon plug 38.

Figure 3E:
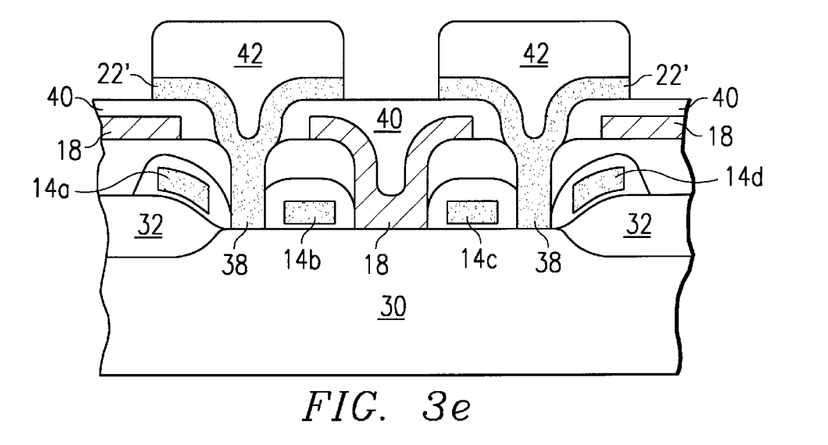

Referring now to FIG. 3c, a sacrificial layer 42 is formed over storage node layer 22'. The composition of this layer 42 is not critical since it will be removed during subsequent processing (as illustrated in FIG. 3g). In the preferred embodiment, an oxide (e.g., SiO$_2$) is used for the sacrificial layer 42. A photoresist (not shown) can be used to make the patterned sacrificial layer 42 into a hard mask. This mask 42 can then be used to etch the base metal layer 22' as illustrated in FIG. 3e. The masking layer 42 is patterned so as to protect the portion of layer 22' which will become part of the storage node 22.

Figure 3F:
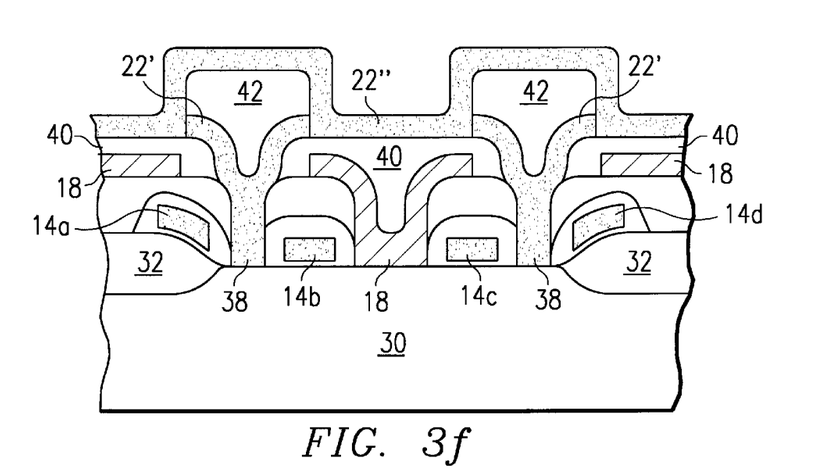
Figure 3G:
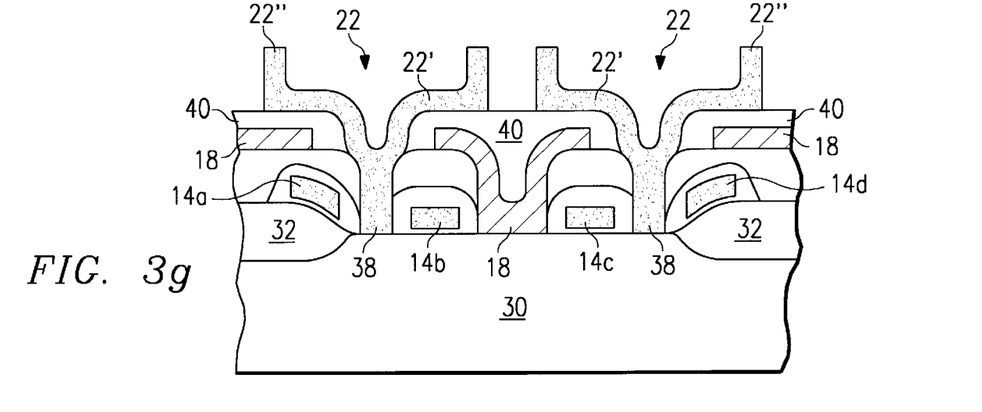

Referring now to FIG. 3f, a second conductive layer 22" is formed over the structure. In the preferred embodiment, layer 22" comprises a conformally deposited polysilicon material which will surround dummy layer 42. The conductive layer 22" preferably surrounds the top and side surfaces of the sacrificial region 42. The choices for the conductive layer 22" are the same as those listed above for base layer 22'. In the preferred embodiment, conductive layer 22" comprises the same material as base layer 22". This feature, however, is not a requirement. In other words, conductive layer 22" can comprise a different material than base layer 22'.

Referring now to FIG. 3g along with FIG. 3f, a portion of the conductive layer 22" on the top surface of the sacrificial region 42 is removed. This removal will expose the top surface of the sacrificial region 22' but will leave a portion of the metal layer 22' on the side surfaces of the sacrificial region. In the preferred embodiment, this removal step is accomplished with an anisotropic etch-back of metal layer 21'. Sacrificial region 42 can then be removed leaving a cylindrical storage node 22. In the preferred embodiment, the storage node 22 is an elongated rectangle with rounded edges. Any shape, however, can be created by the choice of patterning the sacrificial layer 22.

Specific methods of forming the storage node 22 are described in co-pending applications Ser. Nos. 09/014,724 (TI-21537) and 09/014,484 (TI-21973). For example, in the first co-pending application, the storage node is preferably polysilicon which is treated with self-aligned silicide process and then nitrided. In the second co-pending application, the storage node is formed from a metal which is then nitrided. Either of these embodiments or any other embodiment for forming a storage node can be used.

A multiple crown storage node is disclosed in U.S. Pat. No. 5,972,769 (TI-21704). This structure can be used instead of the structure described thus far.

Figure 3H:
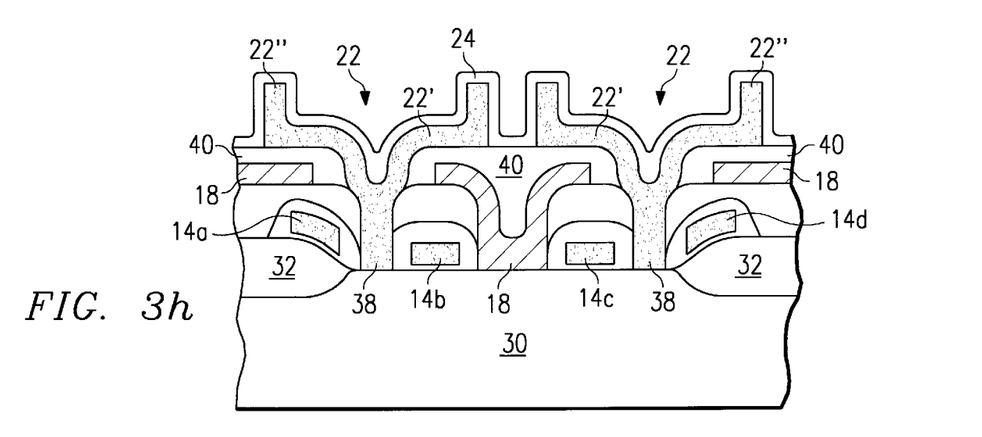

Referring now to FIG. 3h, a dielectric layer 24 can be formed over the storage node 22. Dielectric layer 24 can comprise an oxide, a nitride or a combination of the two (e.g., an oxide-nitride-oxide or oxide-nitride stack or oxynitride). The present invention can also use a wide variety of other dielectrics including tantalum pentoxide (Ta$_2$O$_5$), barium strontium titanate or simply BST (Ba$_{1-x}$Sr$_x$TiO$_3$), strontium titanate (SrTiO$_3$), strontium bismuth tantalate or simply SBT and lead zirconium titanate or simply PZT (Pb$_{1-x}$Zr$_x$TiO$_3$). In the preferred embodiment, a high dielectric constant material (i.e., k>~20) is used. For example, in one embodiment about 15 nm of Ta$_2$O$_5$ is deposited at about 400° C.

After the dielectric layer 24 is formed a two step anneal is performed. This two step post dielectric deposition anneal will improve the capacitor electrical performance including the effective oxide thickness (T$_{eff}$) and leakage current density. The two-step anneals are typically applied to as-deposited films. The first anneal, preferably O$_2$ plasma, is used to render energetic O$_2$ ions to impinge the as-deposited dielectric films to enrich oxygen concentration and decompose hydrocarbons left in the as-deposited films. The second anneal, preferably an ozone anneal, with or without ultraviolet light irradiation, is employed to remove oxygen plasma induced damage and residual hydrocarbons.

The chemical composition of the dielectric layer will be unique compared to prior art dielectrics. For example, consider an example where a tantalum pentoxide dielectric is formed. Typically as-deposited Ta$_2$O$_x$ is slightly oxygen deficient (i.e., x<5). The two step anneal process of the present invention, however, can render an as-deposited Ta$_2$O$_x$ material to become stoichiometric (i.e., x=5) or slightly oxygen rich (i.e., x>5).

In the preferred embodiment, the crystal structure of dielectric layer 24 will not change. It will remain in the amorphous phase since both the plasma treatment and the ozone anneal are performed at a temperature in the range of about 20° C. to about 350° C. Even though the crystal structure may remain amorphous, however, the density could be improved due to the increased oxygen content.

In an alternative embodiment, the ozone anneal can be performed after a crystallization anneal. The crystallization anneal will transform an amorphous layer into a crystalline (e.g., polycrystalline) anneal. For example, dielectric layer 24 could be heated in an O$_2$ or N$_2$O ambient to a temperature of about 700° C. The anneal could be performed either as a furnace anneal or as a rapid thermal anneal. This additional step could improve tantalum pentoxide capacitor performance, especially for a metal-insulator-semiconductor capacitor.

The two-step anneal process can be applied to as-deposited amorphous Ta$_2$O$_5$ films 24 on either semiconductor, ceramic, or metal bottom electrodes 22. It is further noted that the present invention can be applied to other dielectrics such as BST, PZT, SBT, SrTiO$_3$, NO, ONO or others. The present invention is especially useful with dielectrics grown from metal-organic sources.

Figure 3I:
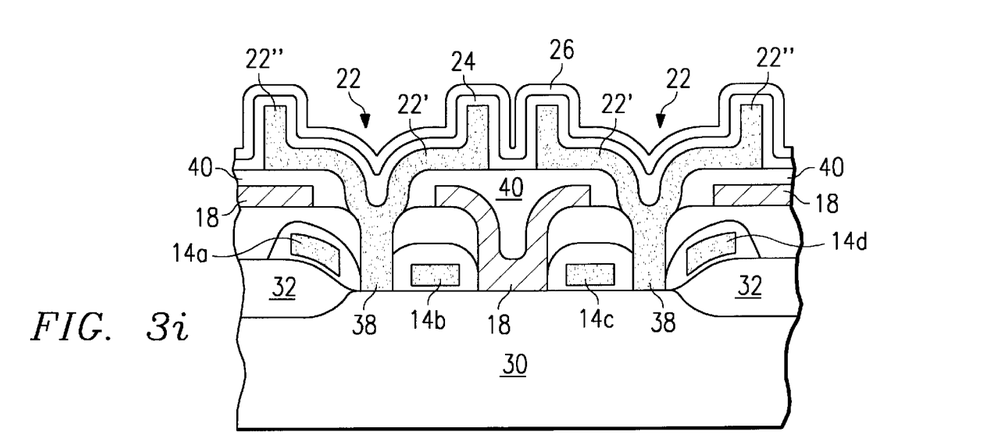

As illustrated in FIG. 3i, top electrode 26 is formed over dielectric layer 24. Top electrode 26 can comprise just about any conductive material. The only criteria is that the electrode material be physically (e.g., adhesively, thermally) compatible with dielectric material 24. For example, electrode 26 can comprise Si (e.g., polysilicon), a metal (e.g., Al, Cu, Pd, Pt, Ru, Au, Ag, Ta, Ti, Mo, W), a silicide (e.g., $TaSi_x$, $TiSi_x$, $AlSi_x$, $CoSi_x$, $WSi_x$, $MoSi_x$, an alloy silicide), a conductive nitride (e.g., TiN, TiAlN, TaSiN, WSiN, WN, MoN, RuN, SnN, ZrN), a conducive oxide (e.g., $RuO_2$, SnO, ZO, IrO), or other conductive materials (e.g., a carbide such as tantalum carbide, a boride such as titanium boride).

It is noted that a number of additional steps will be required before the DRAM device is completed. For example, additional metal layer(s) can be used for interconnects. Also, the drive with need a protective overcoat and packaging. Since these steps are not critical to the present invention, they will not be described here beyond the acknowledgment of their existence.

The materials and process options for forming a storage capacitor of the present invention are summarized in Table 1. It is noted that Table 1 lists only some of the examples of the present invention and is not intended to encompass all possible embodiments.

TABLE 1

| Element | Materials | Deposition Methods |
|---|---|---|
| Bottom Electrode 22 | W, Pt, Mo, metal alloy, TaSiN, TiSiN, WSiN, MoSiN, TiAlN, WN, MoN, metal alloy silicon nitride, doped poly Si | CVD, plasma enhanced CVD, sputtering |
| Dielectric 24 | $Ta_2O_5$, $Ba_{1-x}Sr_xTiO_3$, $Pb_{1-x}Zr_xTiO_3$, $SrTiO_3$ | MOCVD, plasma enhanced MOCVD |
| Top Electrode 26 | W, Pt, Mo, metal alloy, TaSiN, TiSiN, WSiN, MoSiN, TiAlN, WN, MoN, meal alloy silicon nitride, doped poly Si | CVD, plasma enhanced CVD, sputtering |

Embodiments of the present invention have been fabricated experimentally. To begin, N-type Si(100) wafers 30 were processed with TiN/sputtered W/WN/$Ta_2O_5$/Au. The details of the processing can be found above and in co-pending incorporated patent applications Ser. No. 09/014,724 (TI-21537) and Ser. No. 09/014,484 (TI-21973). After $Ta_2O_5$ deposition, both $O_2$ plasma and $O_3$ anneals were performed. Gold was then evaporated onto the $Ta_2O_5$ dielectric for evaluation of a simple planar capacitor. Since the interface between dielectric 24 bottom electrode 22 and is most affected by oxidation during the $Ta_2O_5$ processing, the leakage current density versus voltage was measured to determine critical voltage $V_c$. For these purposes, the critical voltage $V_c$ is defined as the voltage with a leakage current density of $10^{-8}$ A/cm$^2$. The effective oxide thickness $T_{eff}$ is derived and measured from the equation $C/A=\epsilon_0*3.9/T_{eff}$ where the capacitance density C/A is obtained from C-V measurements, $\epsilon_0$ is the vacuum permitivity and 3.9 is the dielectric constant of silicon dioxide.

The results of the electrical measurements of the fabricated planar capacitors from different deposition conditions of the CVD $Ta_2O_5$ films are listed in Table 2. Typically, CVD $Ta_2O_5$ films have a high leakage associated with defects from oxygen vacancies, residual hydrogen carbon, and low work function of bottom electrodes. Low work function of bottom electrodes result in high leakage due to Schottky emission leakage mechanisms for a $Ta_2O_5$ metal insulator metal (MIM) capacitor. Apparently, only $O_2$ plasma treatment following $Ta_2O_5$ deposition does not result in good electrical performance. Combining both of the $O_2$ plasma treatment and $O_3$ anneal, however, dramatically reduces the capacitor leakage. This reduction in turn increases the critical voltage. For high density DRAM applications such as 256 Meg DRAM, the critical voltage should be 1.0 V or above. In addition, the $T_{eff}$ is also decreased possibly due to increase of $Ta_2O_5$ dielectric constant and improvement of the bottom electrode interface. Two-step anneals render the $Ta_2O_5$ capacitor to reach the leakage requirements. Therefore, $Ta_2O_5$ capacitors can be applied to DRAMs with a density of 256 megabits or more.

TABLE 2

| | 1 | 2 | 3 | 4 | 5 | 6 | 7 |
|---|---|---|---|---|---|---|---|
| Metal | sp-W | sp-W | sp-W | sp-W | sp-W | CVD W | CVD W |
| $N_2$ plasma 400° C. | yes | yes | yes | no | no | no | no |
| RTN, 700° C. 1 min. | yes | yes | yes | yes | yes | yes | yes |
| $NH_3$ gas Bottom Electrode | $WN_x$ | $WN_x$ | $WN_x$ | $WN_x$ | $WN_x$ | $WN_x$ | $WN_x$ |
| $Ta_2O_5$ growth temp (° C.) | 400 | 400 | 400 | 450 | 450 | 480 | 480 |
| $O_2$ plasma 100 W 380° C. 15 min. | yes | yes | yes | yes | yes | yes | yes |
| $O_3$ Anneal 270° C. 10 min. | no | yes | yes | no | yes | no | yes |
| Top Electrode | Au | Au | Au | Au | Au | Au | Au |
| +$V_C$ (V) | 1.28 | 2.07 | 1.41 | 0.80 | 1.79 | shorted | 1.72 |
| $T_{eff}$ (nm) | 5.38 | 4.39 | 4.70 | 6.07 | 4.14 | shorted | 3.95 |

Figure 4:
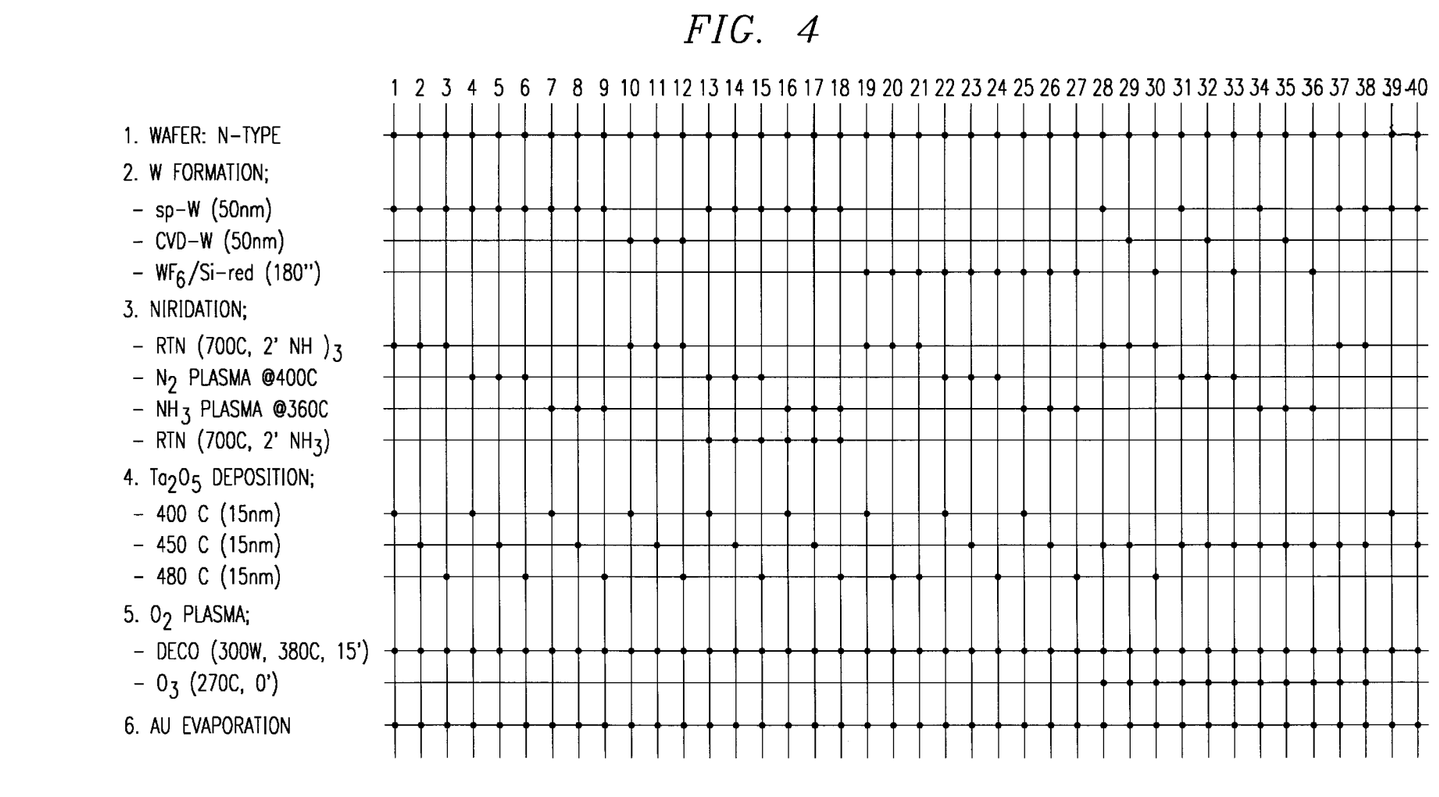
FIG. 4 is a table detailing an experimental test of capacitors built using the present invention.

FIG. 4 provides a table of results of further experimentation. Forty experimental devices were fabricated. Each of these are listed across the top of the figure. Each of these wafers went through at least six processing steps, namely 1.) wafer, 2.) tungsten formation, 3.) nitridation, 4.) $Ta_2O_5$ deposition, 5.) $O_2$ plasma, and 6.) gold evaporation. These steps are listed down the side of the figure. Several of the steps include more than one options. The filled in circle indicates which options were used for each of the forty wafers.

Reviewing the entries in the figure, the tungsten bottom electrode was formed in one of three ways—sputtering, chemical vapor deposition, or deposition by a replacement process using $WF_6$ gas. In this process, silicon is replaced by tungsten during reaction of $WF_6+Si\rightarrow W+SiF_x$ where $SiF_x$ is pumped away in the vapor phase. The nitridation steps could be a rapid thermal nitridation, a nitrogen plasma or an ammonia plasma.

The results of the experimentation is tabulated in Table 3

TABLE 3

| Wafer # | 1 | 2 | 3 | 4 | 5 | 6 | 7 | 8 | 9 | 10 |
|---|---|---|---|---|---|---|---|---|---|---|
| Teff(nm) | 4.45 | 6.07 | 5.70 | 5.24 | 5.56 | 5.31 | 9.78 | 8.27 | 7.79 | 5.25 |
| +Vc | 1.23 | 0.80 | 0.91 | 1.24 | 0.95 | 0.85 | 3.48 | 1.67 | 2.30 | 1.05 |
| −Vc | 2.40 | 3.00 | 2.91 | 1.38 | 3.93 | 4.01 | >5.0 | >5.0 | >5.0 | 4.65 |

| Wafer # | 11 | 12 | 13 | 14 | 15 | 16 | 17 | 18 | 19 | 20 |
|---|---|---|---|---|---|---|---|---|---|---|
| Teff(nm) | 4.50 | 3.89 | 5.94 | 7.89 | 5.05 | 8.87 | 9.40 | 7.90 | — | — |
| +Vc | 0.64 | 0.66 | 1.20 | 0.88 | 0.65 | 3.51 | 2.86 | 3.31 | short | short |
| −Vc | 2.89 | 3.20 | >5.0 | 4.27 | 4.08 | >5.0 | >5.0 | >5.0 | short | short |

| Wafer # | 21 | 22 | 23 | 24 | 25 | 26 | 27 | 28 | 29 | 30 |
|---|---|---|---|---|---|---|---|---|---|---|
| Teff(nm) | — | 7.22 | 7.35 | 5.43 | 6.87 | 8.45 | 5.64 | 4.14 | 4.94 | 3.95 |
| +Vc | short | 1.50 | 0.59 | 1.25 | 1.75 | 1.83 | 1.78 | 1.79 | 2.00 | 1.72 |
| −Vc | short | 4.50 | 1.79 | 2.97 | >5.0 | 4.95 | >5.0 | >5.0 | 3.18 | 2.17 |

| Wafer # | 31 | 32 | 33 | 34 | 35 | 36 | 37 | 38 | 39 | 40 |
|---|---|---|---|---|---|---|---|---|---|---|
| Teff(nm) | 6.29 | 6.92 | 7.56 | 5.21 | 7.06 | 5.38 | 5.50 | 6.81 | 5.90 | 5.61 |
| +Vc | 2.42 | 2.15 | 2.35 | 4.15 | 1.90 | 2.38 | 2.87 | 2.90 | 0.85 | 0.69 |
| −Vc | 3.50 | 4.73 | short | >5.0 | >5.0 | 4.38 | 3.53 | >5.0 | 3.80 | 2.00 |

From feasibility studies, all capacitors with a bottom electrodes using surface nitrided WN resulted in significant increase $+E_c(=+V_c/T_{\it{eff}})$ compared to capacitors using W bottom electrode. The $NH_3$-nitrided WN gave the highest $+E_c$ of 4.2 MV/cm without $O_3$ anneal. With $O_3$ anneal, the $+E_c$ has the highest value of 8 MV/cm. Therefore, based on feasibility studies and extrapolation, production quality devices should be able to meet the requirements of $+Ec=5.0$ MV/cm (+1.0 Vc/2.0 nm).

The experimentation also led to the observation that RTN using $NH_3$ gas at 700° C. for one minute resulted in uniform ~3.0 nm surface WN on sputtered W bottom electrodes. This result shows that surface nitridation is a robust and manufacturable process.

Replacement W at 300° C. using HF wet cleaning and in-situ $H_2$ plasma for pre-cleaning had the best W layer in terms of wormhole formation, roughness, and W thickness compared to other deposition temperatures and pre-cleaning methods. However, replacement W at 300° C. still had significant wormhole and encroachment which could be a key limitation for manufacturing applications. To overcome this limitation, a metal SN with an adhesion layer could be used.

Mechanistic studies of leakage conduction for MIM capacitors were also performed. These studies confirmed Schottky emission for $Ta_2O_5$ MIM capacitor, thereby verifying the proposal that using WN and WSiN provides for high work function and oxidation resistance. While $O_3$-anneal effects are still under further evaluation, initial results have shown that an $O_3$-anneal increases Schottky barrier height and dielectric constant, likely due to an increase in the oxygen concentration. Therefore, the $O_3$-anneal lowered the leakage as well as $T_{\it{eff}}$. Two-step anneals with $O_2$ plasma and $O_3$ anneal have both advantages of high energy oxygen provided into $Ta_2O_5$ films from $O_2$ plasma and $O_3$ anneal to further supply oxygen due to low decomposition energy barrier and to anneal out damage caused by $O_2$ plasma.

The method and structure of the present invention provide an integrated circuit capacitor which can be used in a wide variety of applications. While described thus far in the context of a dynamic random access memory (DRAM), the present invention can also be used to form a capacitor for an analog-to-digital (A/D) converter, a digital-to-analog (D/A) converter, or just about any other integrated circuit chip While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming an integrated circuit capacitor, the method comprising the steps of:

forming a storage node electrode;

depositing a dielectric layer over the storage node electrode;

performing an $O_2$ plasma anneal after depositing the dielectric layer;

performing an ozone anneal after performing the $O_2$ plasma anneal; and depositing a top electrode over the dielectric layer.

2. The method of claim 1 wherein the step of forming a storage node electrode comprises forming a silicon storage node electrode.

3. The method of claim 1 wherein the step of forming a storage node electrode comprises forming a metal storage node electrode.

4. The method of claim 1 wherein the step of forming a storage node electrode comprises forming a ceramic storage node electrode.

5. The method of claim 1 wherein the step of depositing a dielectric layer comprises depositing a tantalum pentoxide layer.

6. The method of claim 1 wherein the step of depositing a dielectric layer comprises depositing a lead zirconium titanate layer.

7. The method of claim 1 wherein the step of depositing a dielectric layer comprises depositing a barium strontium titanate layer.

8. The method of claim 1 wherein the step of depositing a dielectric layer comprises depositing a strontium titanate layer.

9. The method of claim 1 wherein the step of depositing a dielectric layer comprises depositing a high dielectric constant material.

10. The method of claim 1 wherein the step of depositing a dielectric layer comprises depositing a dielectric derived from a material organic source.

11. The method of claim 1 wherein the ozone anneal is performed in the presence of ultra violet light irradiation.

12. The method of claim 1 wherein the ozone anneal is performed without ultra violet light irradiation.

13. The method of claim 1 and further comprising the step of performing a crystallization anneal prior to the step of performing an ozone anneal.

* * * * *